United States Patent
Chin

(10) Patent No.: US 12,094,788 B2
(45) Date of Patent: Sep. 17, 2024

(54) METHOD FOR DETERMINING CONTOUR OF SEMICONDUCTOR STRUCTURE

(71) Applicant: CHANGXIN MEMORY TECHNOLOGIES, INC., Hefei (CN)

(72) Inventor: Jo-Lan Chin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 597 days.

(21) Appl. No.: 17/469,992

(22) Filed: Sep. 9, 2021

(65) Prior Publication Data
US 2022/0301945 A1  Sep. 22, 2022

Related U.S. Application Data

(63) Continuation of application No. PCT/CN2021/105233, filed on Jul. 8, 2021.

(30) Foreign Application Priority Data

Mar. 17, 2021 (CN) .......................... 202110284726.2

(51) Int. Cl.
*H01L 21/66* (2006.01)
*G01B 11/24* (2006.01)
*G01B 11/26* (2006.01)

(52) U.S. Cl.
CPC .............. *H01L 22/12* (2013.01); *G01B 11/24* (2013.01); *G01B 11/26* (2013.01)

(58) Field of Classification Search
CPC ......... H01L 22/12; G01B 11/24; G01B 11/26; G01B 15/04; G01B 2210/56
See application file for complete search history.

(56) References Cited

U.S. PATENT DOCUMENTS

| | | | |
|---|---|---|---|
| 9,466,537 B2 | 10/2016 | Kim et al. | |
| 11,139,142 B2 | 10/2021 | Yuli et al. | |
| 2012/0107970 A1* | 5/2012 | Takaki | H01L 22/12 257/E21.53 |
| 2016/0204041 A1 | 7/2016 | Kim et al. | |
| 2020/0373120 A1 | 11/2020 | Yuli et al. | |

FOREIGN PATENT DOCUMENTS

| | | |
|---|---|---|
| CN | 111199895 A | 5/2020 |
| CN | 111987008 A | 11/2020 |
| CN | 113053771 A | 6/2021 |

* cited by examiner

*Primary Examiner* — Dale E Page
*Assistant Examiner* — Quovaunda Jefferson
(74) *Attorney, Agent, or Firm* — Kilpatrick Townsend & Stockton LLP

(57) ABSTRACT

A method for determining a contour of a semiconductor structure is disclosed, which includes: acquiring a best inclination angle of an electron beam; irradiating a sidewall of the semiconductor structure with the electron beam at the best inclination angle, to obtain a measured width of an orthographic projection of the sidewall of the semiconductor structure within a plane perpendicular to an incidence direction of the electron beam; and determining whether a bottom of the semiconductor structure is necked based on the measured width.

20 Claims, 6 Drawing Sheets

METHOD FOR DETERMINING CONTOUR OF SEMICONDUCTOR STRUCTURE

CROSS-REFERENCE TO RELATED APPLICATION

This is a continuation application of International Patent Application No. PCT/CN2021/105233, filed on Jul. 8, 2021, which claims priority to China Patent Application No. 202110284726.2, filed to the Patent Office of the People's Republic of China on Mar. 17, 2021, and entitled "METHOD FOR DETERMINING CONTOUR OF SEMICONDUCTOR STRUCTURE". The disclosures of International Patent Application No. PCT/CN2021/105233 and China Patent Application No. 202110284726.2 are hereby incorporated by reference in their entireties.

TECHNICAL FIELD

The present application relates to the technical field of semiconductors, and particularly to a method for determining a contour of a semiconductor structure.

BACKGROUND

As a semiconductor memory device commonly used in computers, a Dynamic Random Access Memory (DRAM) consists of many duplicate memory cells. The DRAM usually includes a capacitor and a transistor. The capacitor is used to store data. The transistor is used to control access to data stored in the capacitor. A word line of the DRAM is electrically connected to a gate of the transistor and controls turning-on/off of the transistor. Moreover, a source of the transistor is electrically connected to a bit line to form a current transmission path. Meanwhile, the bit line sends an electric signal to the transistor through a bit line contact structure. A bottom contour of a bit line structure formed by the bit line and the bit line contact structure is an important factor that affects the conductivity of the bit line. If the bottom of the bit line structure is relatively narrow, the contact area with a substrate at the bottom of the bit line structure may be reduced, and the conductivity of the DRAM may be decreased.

There are two conventional solutions to measure the bottom contour of the bit line structure: a method of Physical Failure Analysis (PFA) and an online measurement method. The PFA refers to that slice measurement is performed on the DRAM, and the state of the bottom contour of the bit line structure may be observed directly. However, PFA is time-consuming and destructive, and thus may waste many wafers and bring a relatively high cost. By online measurement, no bottom contour of the bit line structure but only the top size of the bit line structure can be measured, and the top size of the bit line structure cannot directly reflect the state of the bottom contour of the bit line structure, so that the test result is not accurate.

SUMMARY

According to some embodiments, there is provided a method for determining a contour of a semiconductor structure.

The method for determining the contour of the semiconductor structure is used to determine a bottom contour of a semiconductor structure, and includes:

acquiring a best inclination angle of an electron beam;

irradiating a sidewall of the semiconductor structure with the electron beam at the best inclination angle, to obtain a measured width of an orthographic projection of the sidewall of the semiconductor structure within a plane perpendicular to an incidence direction of the electron beam; and determining whether a bottom of the semiconductor structure is necked based on the measured width.

A computer device includes a memory and a processor. The memory stores a computer program. The processor executes the computer program to implement the steps of the abovementioned method.

A computer-readable storage medium has stored thereon a computer program that, when being executed by a processor, implements the steps of the abovementioned method.

The above description is only the summary of the technical solutions of the present application. Detailed descriptions will now be made with preferred embodiments of the present application in junction with the drawings, to make the technical means of the present application understood more clearly and implemented according to the contents of the specification.

BRIEF DESCRIPTION OF THE DRAWINGS

To describe technical solutions of the embodiments of the present application more clearly, the following briefly introduces the accompanying drawings required for describing the embodiments. Apparently, the accompanying drawings in the following description show only some embodiments of the present application, and a person skilled in the art may still derive other drawings from these accompanying drawings without creative efforts.

DETAILED DESCRIPTION

Figure 1:
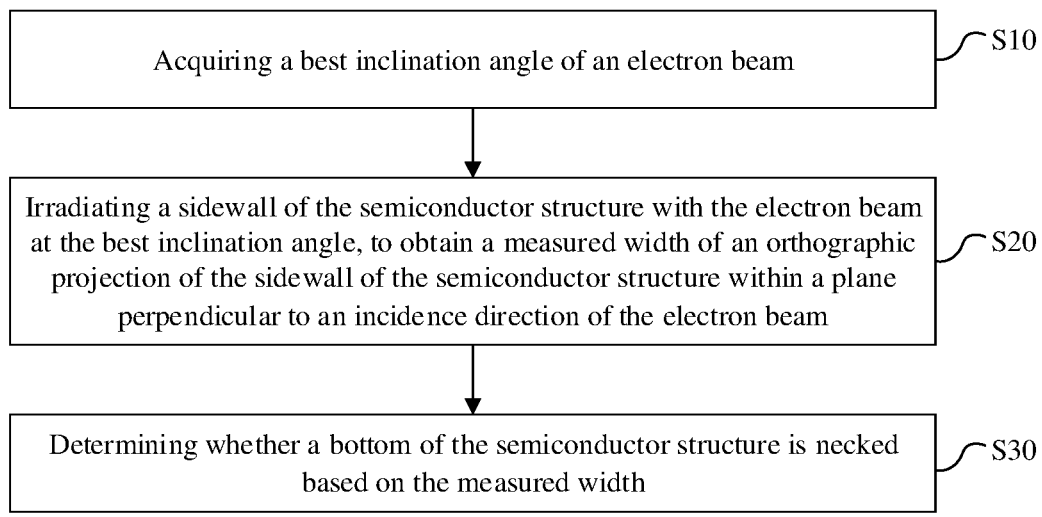
FIG. 1 illustrates a schematic flowchart of a method for determining a contour of a semiconductor structure according to an embodiment of the present application.

For convenience of an understanding of the present application, the present application will now be described more fully hereinafter with reference to the related drawings. The embodiments of the present application are illustrated in the drawings. The present application may, however, be embodied in many different forms which are not limited to the embodiments described herein. Rather, these embodiments are provided so that the disclosure of the present application will be thorough and complete.

Unless defined otherwise, all technical and scientific terms used herein have the same meaning as commonly understood by those skilled in the art to which the present application belongs. The terms used herein in the specification of the present application is for the purpose of describing specific embodiments only and is not intended to be limiting of the present application.

It should be understood that when an element or layer is referred to as "on", "adjacent to", "connected to" or "coupled to" another element or layer, it may be directly on the other element or layer, adjacent to the other element or layer, or connected to or coupled to the other element or layer, or there may be an intermediate element or layer. In contrast, when an element is referred to as "directly on", "directly adjacent to", "directly connected to" or "directly coupled to" another element or layer, there is no intermediate element or layer. It should be understood that although the terms first, second, third, etc. may be used to describe various elements, components, regions, layers, doping types, and/or portions, these elements, components, regions, layers, doping types, and/or portions should not be limited by these terms. These terms are only used to distinguish one element, component, region, layer, doping type, or portion from another element, component, region, layer, doping type or portion. Therefore, a first element, component, region, layer, doping type or portion discussed below may be expressed as a second element, component, region, layer or portion without departing from the teaching of the present application. For example, a first doping type may be referred to as a second doping type, and similarly, the second doping type may be referred to as the first doping type. The first doping type and the second doping type are different doping types. For example, the first doping type may be a P type, and the second doping type may be an N type. Alternatively, the first doping type may be the N type, and the second doping type may be the P type.

Spatial relationship terms such as "beneath", "below", "lower", "under", "above", or "upper" may be used herein to describe a relationship between one element or feature and another element or feature shown in the figures. It should be understood that in addition to the orientations shown in the figures, the spatial relationship terms further include different orientations of devices in use and operation. For example, if the devices in the figures are turned over, an element or feature described as being "below" or "under" or "beneath" another element will be oriented as being "above" the other element or feature. Therefore, the exemplary terms "below" and "under" may include up and down orientations. In addition, the devices may also include additional orientations (e.g., rotation for 90 degrees or other orientations), and the spatial descriptors used herein are interpreted accordingly.

As used herein, the singular forms "a", "an", "one", and "the" may include the plural forms as well, unless the context clearly dictates otherwise. It should also be understood that the terms "comprising/including" or "having", etc. specify the presence of stated features, integers, steps, operations, components, portions, or combinations thereof, but do not preclude the possibility of the presence or addition of one or more other features, integers, steps, operations, components, portions, or combinations thereof. Also, in the present specification, the term "and/or" includes any and all combinations of the associated listed items.

The technical solutions of the present application will now be described with specific embodiments.

According to an embodiment of the present application, there is provided a method for determining a contour of a semiconductor structure, which is used to determine a bottom contour of a semiconductor structure. As illustrated in FIG. 1, the determination method includes the following operations.

At S10, a best inclination angle of an electron beam is acquired.

At S20, a sidewall of the semiconductor structure is irradiated with the electron beam at the best inclination angle, to obtain a measured width of an orthographic projection of the sidewall of the semiconductor structure within a plane perpendicular to an incidence direction of the electron beam.

At S30, whether a bottom of the semiconductor structure is necked is determined based on the measured width.

In the method for determining the contour of the semiconductor structure provided in the embodiment, after the best inclination angle of the electron beam is acquired, the sidewall of the semiconductor structure is irradiated with the electron beam at the best inclination angle, to obtain the measured width of the orthographic projection of the sidewall of the semiconductor structure within the plane perpendicular to the incidence direction of the electron beam. Then, whether the bottom of the semiconductor structure is necked is determined based on the measured width. According to the determination method of the present application, whether the bottom of the semiconductor structure is necked is determined accurately by online measurement without damaging any wafer. The time consumption is relatively low, and no wafer is damaged so that the cost may be reduced significantly. The determination result is correlated more highly with a slice measurement structure, and the determination result is high in accuracy.

In an embodiment, the best inclination angle may be larger than 0° and smaller than or equal to 30°. Specifically, the best inclination angle is 1°, 2°, 5°, 10°, 15°, 20°, 25°, 30°, or the like. An inclination angle of the electron beam is an included angle between the electron beam and a height direction of the semiconductor structure.

Figure 2:
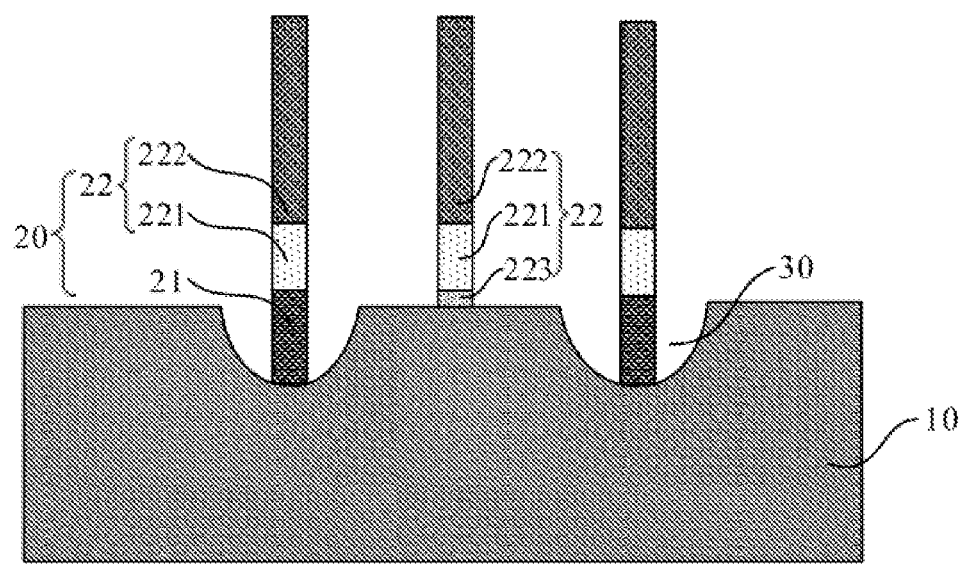
FIG. 2 illustrates a partial schematic sectional view of a semiconductor structure according to an embodiment of the present application.

In an embodiment, as illustrated in FIG. 2, the semiconductor structure 20 at S20 is formed on a substrate 10. A plurality of shallow trench isolation structures (not illustrated) and active areas arranged in an array (not illustrated) are formed in the substrate 10. Moreover, a plurality of parallel spaced buried gate word lines intersected with the active areas may be formed in the substrate 10. A source region and a drain region may be formed in the active areas on both opposite sides of each buried gate word line.

In an embodiment, referring to FIG. 2 continually, a bit line contact hole is formed at a portion in the substrate corresponding to the drain region. The semiconductor structure 20 at S20 includes a bit line contact structure 21 and a bit line 22. The bit line contact structure 21 is located in the bit line contact hole. The bit line 22 is located on an upper surface of the bit line contact structure 21. Specifically, the bit line contact structure 21 may be a doped polycrystalline silicon layer. The bit line 22 may include a metal layer 221 and an insulating layer 222. The insulating layer 222 is located on an upper surface of the metal layer 221. The bit line 22 further includes an intrinsic polycrystalline silicon layer 223. The intrinsic polycrystalline silicon layer 223 is located between the metal layer 221 and the substrate 10, and between adjacent bit line contact structures 21.

As an example, the source region may be electrically connected with the bit line 22 through the bit line contact structure 21.

As an example, determining whether the bottom of the semiconductor structure is necked in the present application refers to determining whether a bottom of the bit line contact structure in the semiconductor structure is necked. For ease of expression, the bottom of the semiconductor structure is used in the following description.

Figure 3:
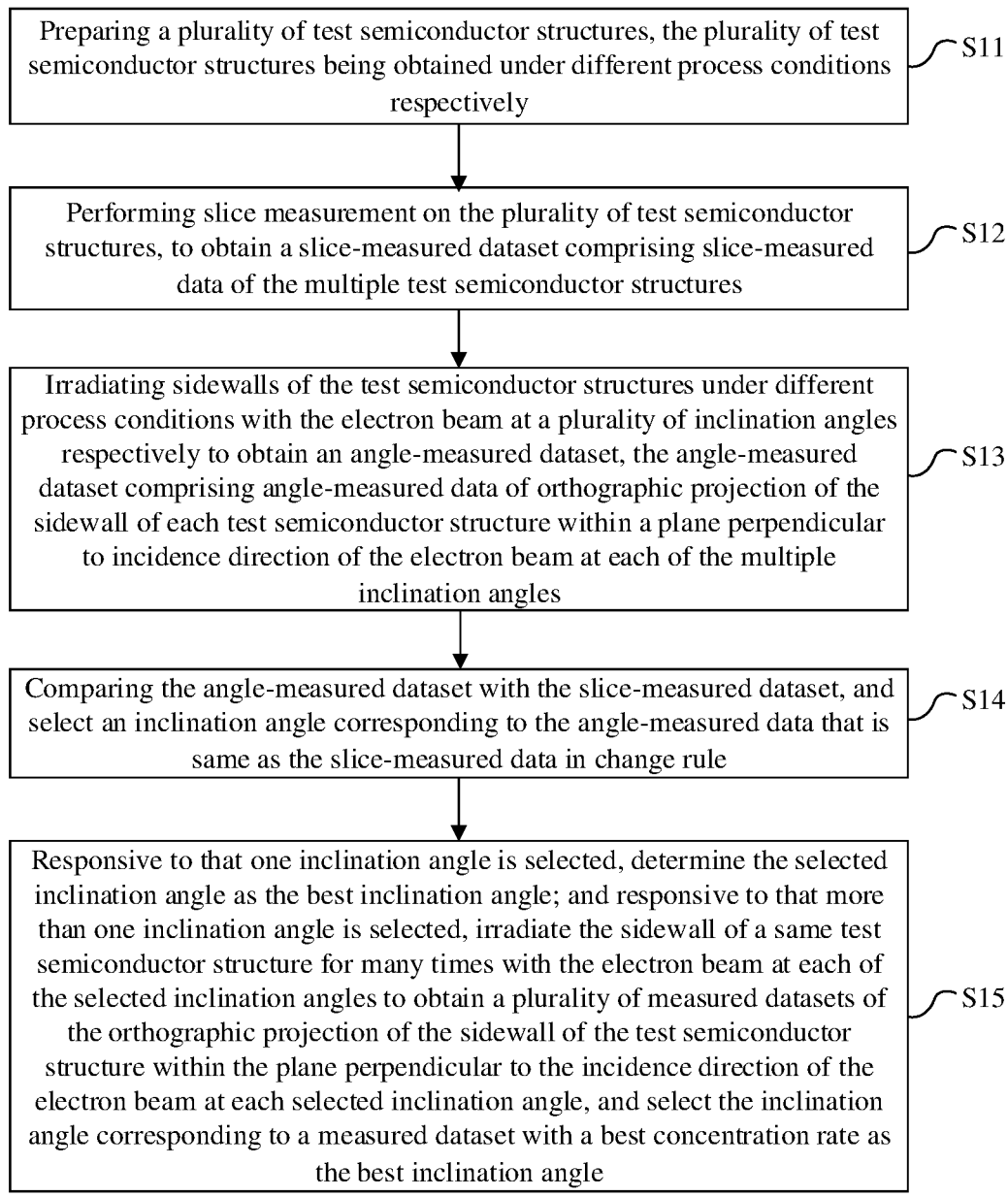
FIG. 3 illustrates a schematic flowchart of acquiring a best inclination angle of an electron beam according to an embodiment of the present application.

In an embodiment, as illustrated in FIG. 3, the operation at S10 that a best inclination angle of an electron beam is acquired includes the following operations.

At S11, multiple test semiconductor structures are prepared. The multiple test semiconductor structures are obtained under different process conditions respectively.

At S12, slice measurement is performed on the multiple test semiconductor structures, to obtain a slice-measured dataset including slice-measured data of the multiple test semiconductor structures.

At S13, sidewalls of the test semiconductor structures under different process conditions are irradiated with the electron beam at multiple inclination angles respectively to obtain an angle-measured dataset. The angle-measured dataset includes angle-measured data of orthographic projection of the sidewall of each test semiconductor structure within a plane perpendicular to incidence direction of the electron beam at each of the multiple inclination angles.

At S14, the angle-measured dataset is compared with the slice-measured dataset, and the inclination angle corresponding to the angle-measured data that is same as the slice-measured data in change rule is selected.

At S15, responsive to that one inclination angle is selected, the selected inclination angle is determined as the best inclination angle. Responsive to that more than one inclination angle is selected, the sidewall of the same test semiconductor structure is irradiated for many times with the electron beam at each selected inclination angle, to obtain multiple measured datasets of the orthographic projection of the sidewall of the test semiconductor structure within the plane perpendicular to the incidence direction of the electron beam at each selected inclination angle, and the inclination angle corresponding to the measured dataset with a best concentration rate is selected as the best inclination angle.

As an example, the multiple test semiconductor structures prepared under different process conditions at S11 are different in bottom size. Meanwhile, it is defined that multiple semiconductor structures prepared under the same process condition are the same in bottom size.

As an example, data obtained at S12 by slice measurement adopted in the present application is all practical data of the bottom size of the semiconductor structure and used as data references. For example, there may be, but not limited to, the situation that 5 different test semiconductor structures are prepared under 5 process conditions. The practical bottom sizes of the 5 different test semiconductor structures may be, but not limited to, 25 nm, 24.9 nm, 28 nm, 26.4 nm, and 32 nm respectively and used as a slice-measured dataset.

As an example, specifically, at S13, sidewalls of the 5 test semiconductor structures may be irradiated in sequence at, but not limited to, 3 inclination angles, to obtain 15 pieces of angle-measured data and 3 angle-measured datasets. Each angle-measured dataset includes 5 pieces of angle-measured data. The inclination angle corresponding to the angle-measured data the same as the slice-measured data in change rule may be selected according to the data.

As an example, at S14, the slice-measured dataset under the 5 different process conditions is 25 nm, 24.9 nm, 28 nm, 26.4 nm, and 32 nm, as described above. The 5 pieces of data tend to sequentially decrease, increase, decrease, and finally increase. A first angle-measured dataset is 23 nm, 22.9 nm, 26 nm, 24.4 nm, and 30 nm. A second angle-measured dataset is 24 nm, 25 nm, 26 nm, 27 nm, and 28 nm. The first angle-measured dataset presents a change rule of sequentially decreasing, increasing, decreasing, and finally increasing. The second angle-measured dataset presents a rule of gradually increasing. The angle-measured data corresponding to the first angle-measured dataset presents the same change rule as the slice-measured data corresponding to the slice-measured dataset. That is, the inclination angle corresponding to the first angle-measured dataset is selected.

As an example, at S15, multiple bottoms in the test semiconductor structure may further be irradiated with the electron beam at multiple inclination angles respectively responsive to that more than one inclination angle is selected. The inclination angle corresponding to the measured dataset with the best concentration rate is selected as described above and determined as the best inclination angle.

As an example, the concentration rate refers to a minimum error between multiple pieces of measured data obtained at a set inclination angle. For example, when the inclination angle is 5°, the sidewall of the same test semiconductor structure is irradiated for 5 times to obtain a measured dataset including 25 nm, 25.1 nm, 25.2 nm, 24.9 nm, and 25 nm. When the inclination angle is 10°, a measured dataset including 26 nm, 25 nm, 24 nm, 26.4 nm, and 27 nm is obtained. Clearly, the concentration rate is best when the inclination angle is 5°. The measured width may be directly obtained according to a test instrument without damaging a wafer. Compared with an online measurement technical solution, the solution of the present application has the advantages that the correlation is higher, and the necking condition of the bottom of the semiconductor structure may be reflected accurately.

Figure 4:
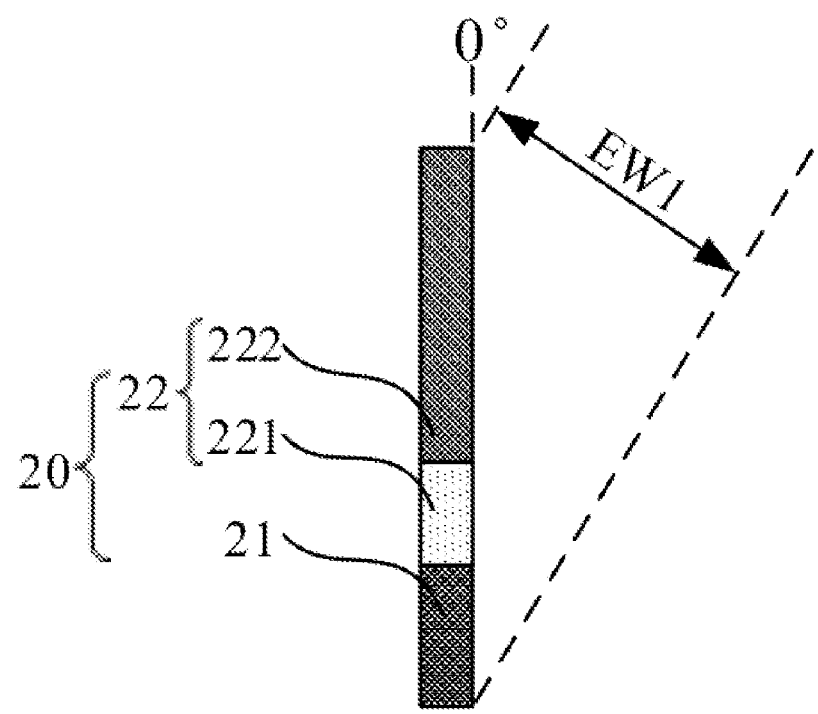
FIG. 4 illustrates a schematic diagram of measuring a provided semiconductor structure of which a bottom is not necked using an electron beam at a best inclination angle according to an embodiment of the present application.

In an embodiment, a bottom of at least one of the multiple test semiconductor structures is not necked. As illustrated in FIG. 3, after the best inclination angle is acquired at S10, the method further includes the following operation. Based on prior measured data, angle-measured data of an orthographic projection of the sidewall of the test semiconductor structure, of which the bottom is not necked, within a plane perpendicular to an incidence direction of the electron beam, obtained after irradiating the sidewall of the test semiconductor structure with the electron beam at the best inclination angle, is set as a target measured width, i.e., Edge Width (EW) 1 illustrated in FIG. 4. The operation at S30 that whether the bottom of the semiconductor structure is necked based on the measured width includes the following operation.

Figure 5:
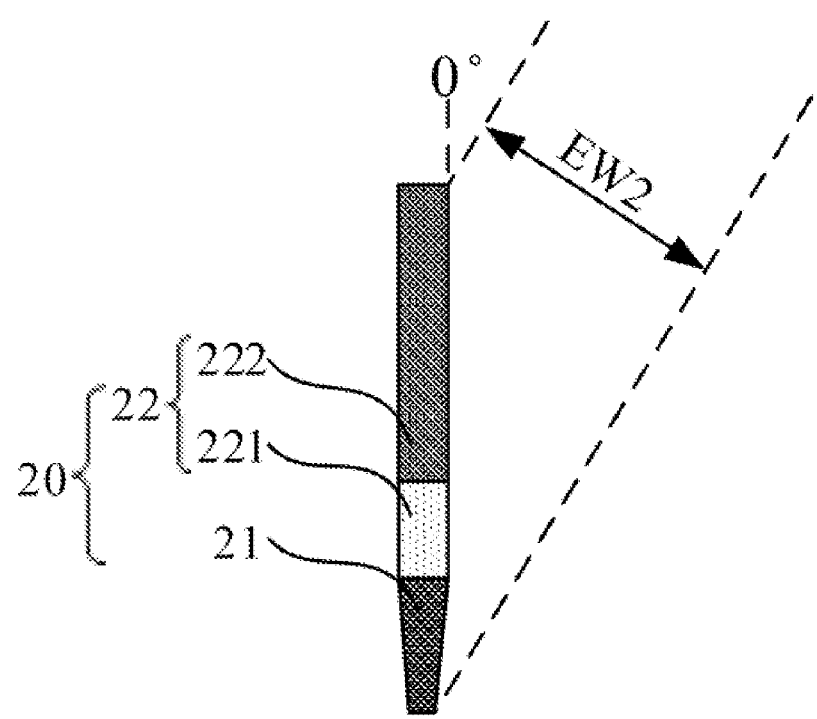
FIG. 5 illustrates a schematic diagram of measuring a provided semiconductor structure of which a bottom is necked using an electron beam at a best inclination angle according to an embodiment of the present application.

At S31, the measured width is compared with the target measured width, and it is determined that the bottom of the semiconductor structure is necked responsive to that the measured width is less than the target measured width, referring to FIG. 5. EW2 in FIG. 5 is a measured bottom width of the test semiconductor structure that is necked.

Figure 6:
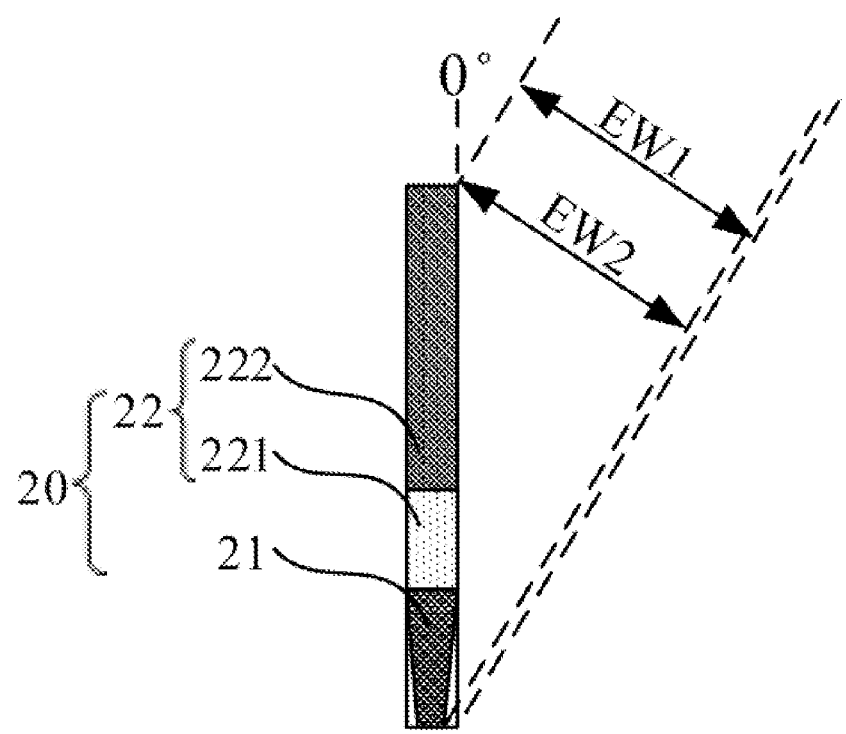
FIG. 6 illustrates a schematic diagram of measuring a provided semiconductor structure of which a bottom is not necked and a provided semiconductor structure of which a bottom is necked using an electron beam at a best inclination angle according to an embodiment of the present application.

In an embodiment, as illustrated in FIG. 6, EW1 in FIG. 6 is a bottom measured width when the bottom of the semiconductor structure is not necked, and EW2 is a bottom measured width when the bottom of the semiconductor structure is necked. EW1 and EW2 are measured at the same best inclination angle. EW1 is greater than EW2. The necking condition of the bottom of the semiconductor structure may be reflected accurately.

In an embodiment, the operation at S20 that the sidewall of the semiconductor structure is irradiated with the electron beam at the best inclination angle, to obtain the measured width of the orthographic projection of the sidewall of the semiconductor structure within the plane perpendicular to the incidence direction of the electron beam further includes the following operations.

At S21, an orthographic projection of the semiconductor structure within the plane perpendicular to the incidence direction of the electron beam at the best inclination angle is acquired.

At S22, the orthographic projection is measured to obtain the measured width at the best inclination angle.

In an embodiment, after the operation at S30 that whether the bottom of the semiconductor structure is necked is determined based on the measured width, the following operation is further included.

At S40, a determination result is verified to determine whether a comparison result of the measured width at the best inclination angle and the target measured width is accurate.

Further, the operation at S40 that the determination result is verified includes the following operations.

At S41, slice measurement is performed on the semiconductor structure to obtain a slice-measured width of the bottom of the semiconductor structure.

At S42, whether the determination result is reliable is determined based on a correlation between the measured width obtained at the best inclination angle and the slice-measured width.

Further, the operation at S42 that whether the determination result is reliable is determined based on a correlation between the measured width obtained at the best inclination angle and the slice-measured width includes the following operation.

It is determined that the method for determining the contour of the semiconductor structure is reliable responsive to that the correlation is more than or equal to a preset correlation, and it is determined that the determination result is unreliable responsive to that the correlation is less than the preset correlation.

Specifically, the preset correlation is set to 0.7, or a numerical value greater than 0.7 and less than or equal to 1. The preset correlation may be 0.8, 0.9, 1.0, or the like.

It is to be noted that the correlation between the measured width obtained at the best inclination angle and the slice-measured width may be acquired by the following method. Multiple measured widths obtained at the best inclination angle are acquired, and the multiple measured widths are connected into a first curve. Multiple slice-measured widths are acquired, and the multiple slice-measured widths are connected into a second curve. An overlapping degree of the first curve and the second curve is determined to obtain the correlation between the measured width obtained at the best inclination angle and the slice-measured width.

In the abovementioned embodiment, PFA slice measurement is performed on the semiconductor structure to obtain the slice-measured width, and the correlation between the measured width at the best inclination angle and the slice-measured width is calculated according to the two values. A relationship between the measured width at the best inclination angle and the slice-measured width may be a linear relationship, or may be another functional relationship. It is determined that the determination result is reliable when the correlation between the measured width at the best inclination angle and the slice-measured width ranges from 0.7 to 1. According to the determination method, slice measurement is avoided, and the wafer loss is reduced. Moreover, only the width data needs to be measured, so that manpower, material resources and time are saved, a research and development engineer is helped to further optimize process parameters to reduce the bottom necking of semiconductor structures, and a novel technical idea is provided for subsequently improving the conductivity of a DRAM.

In an embodiment, whether the bottom of the semiconductor structure is necked affects the conductivity of the DRAM. An electric value of a DRAM that each test semiconductor structure belongs to is measured, and each electric value is compared with the measured width obtained at the best inclination angle to determine that the electric value and the measured width present the same change trend. The method for determining the contour of the semiconductor structure in the present application may further be proved higher in correlation than the online measurement solution.

The present application also discloses a computer device, which includes a memory and a processor. The memory stores a computer program. The processor executes the computer program to implement the steps of the method in any abovementioned embodiment.

The present application also discloses a computer-readable storage medium having stored thereon a computer program that, when being executed by a processor, implements the steps of the method in any abovementioned embodiment.

Specific restrictions to the method for determining a contour of a semiconductor structure in the abovementioned embodiment may refer to the above restrictions to the method for determining the contour of the semiconductor. Elaborations are omitted herein.

It should be understood that, unless clearly described herein, the steps are not strictly limited in execution sequence and may be executed in other sequences. Moreover, at least part of the steps may include multiple sub-steps or stages. These sub-steps or stages are not always executed and completed at the same time but may be executed at different times. These sub-steps or stages are also not always sequentially executed but may be executed in turn or alternately with at least part of the other steps or sub-steps or stages of the other steps.

Those of ordinary skill in the art may understand that all or some flows in the foregoing method embodiment may be completed by instructing related hardware via a computer program, the computer program may be stored in a non-volatile computer-readable storage medium, and when the computer program is executed, the flow in each of the foregoing method embodiments may be included. Any memory, storage, database, or other medium used in the embodiments provided in the present application by reference may include nonvolatile and/or volatile memories.

It is to be noted that the abovementioned embodiment is only for description and not intended to limit the present application.

The various embodiments in the description are all described gradually, and each embodiment mainly explains the difference from other embodiments, and the identical or similar parts of the embodiments are referred to each other.

The technical features of the above embodiments can be combined arbitrarily. In order to make the description concise, all possible combinations of various technical features in the above embodiments are not completely described. However, as long as there is no contradiction in the combination of these technical features, it should be regarded as the scope of this specification.

The foregoing embodiments represent only a few implementations of the present application, and the descriptions are specific and detailed, but should not be construed as limiting the patent scope of the present application. It should be noted that those of ordinary skill in the art may further make variations and improvements without departing from the conception of the present application, and these all fall within the protection scope of the present application. Therefore, the patent protection scope of the present application should be subject to the appended claims.

The invention claimed is:

1. A method for determining a bottom contour of a semiconductor structure, comprising:
acquiring a best inclination angle of an electron beam;
irradiating a sidewall of the semiconductor structure with the electron beam at the best inclination angle, to obtain a measured width of an orthographic projection of the sidewall of the semiconductor structure within a plane perpendicular to an incidence direction of the electron beam; and
determining whether a bottom of the semiconductor structure is necked based on the measured width.

2. The method of claim 1, wherein acquiring the best inclination angle of the electron beam comprises:
preparing a plurality of test semiconductor structures, the plurality of test semiconductor structures being obtained under different process conditions respectively;
performing slice measurement on the plurality of test semiconductor structures, to obtain a slice-measured dataset comprising slice-measured data of the plurality of test semiconductor structures;
irradiating sidewalls of the test semiconductor structures under different process conditions with the electron beam at a plurality of inclination angles respectively to obtain an angle-measured dataset, the angle-measured dataset comprising angle-measured data of orthographic projection of the sidewall of each test semiconductor structure within a plane perpendicular to incidence direction of the electron beam at each of the plurality of inclination angles;
comparing the angle-measured dataset with the slice-measured dataset, and selecting an inclination angle corresponding to the angle-measured data that is same as the slice-measured data in change rule; and
responsive to that one inclination angle is selected, determining the selected inclination angle as the best inclination angle; and responsive to that more than one inclination angle is selected, irradiating the sidewall of a same test semiconductor structure for many times with the electron beam at each of the selected inclination angles, to obtain a plurality of measured datasets of the orthographic projection of the sidewall of the test semiconductor structure within the plane perpendicular to the incidence direction of the electron beam at each selected inclination angle, and selecting the inclination angle corresponding to a measured dataset with a best concentration rate as the best inclination angle.

3. The method of claim 2, wherein a bottom of at least one of the plurality of test semiconductor structures is not necked; after acquiring the best inclination angle, the method further comprises: based on prior measured data, setting angle-measured data of an orthographic projection of a sidewall of a test semiconductor structure, of which the bottom is not necked, within a plane perpendicular to an incidence direction of the electron beam, obtained after irradiating the sidewall of the test semiconductor structure with the electron beam at the best inclination angle, as a target measured width; and determining whether the bottom of the semiconductor structure is necked based on the measured width comprises:
comparing the measured width with the target measured width, and determining that the bottom of the semiconductor structure is necked responsive to that the measured width is less than the target measured width.

4. The method of claim 1, wherein irradiating the sidewall of the semiconductor structure with the electron beam at the best inclination angle, to obtain the measured width of the orthographic projection of the sidewall of the semiconductor structure within the plane perpendicular to the incidence direction of the electron beam comprises:
acquiring an orthographic projection of the semiconductor structure within the plane perpendicular to the incidence direction of the electron beam at a best inclination angle; and
measuring the orthographic projection to obtain the measured width at the best inclination angle.

5. The method of claim 1, wherein the best inclination angle is larger than 0° and smaller than or equal to 30°.

6. The method of claim 1, wherein the semiconductor structure comprises a bit line contact structure and bit lines located on an upper surface of the bit line contact structure.

7. The method of claim 6, wherein the bit line contact structure is a doped polycrystalline silicon layer.

8. The method of claim 6, wherein a bit line comprises a metal layer and an insulating layer located on an upper surface of the metal layer.

9. The method of claim 8, wherein the bit line further comprises an intrinsic polycrystalline silicon layer, the intrinsic polycrystalline silicon layer being located between the metal layer and a substrate, and between adjacent bit line contact structures.

10. The method of claim 1, after determining whether the bottom of the semiconductor structure is necked based on the measured width, further comprising:
verifying a determination result.

11. The method of claim 10, wherein verifying the determination result comprises:
performing slice measurement on the semiconductor structure to obtain a slice-measured width of the bottom of the semiconductor structure; and
determining whether the determination result is reliable based on a correlation between the measured width obtained at the best inclination angle and the slice-measured width.

12. The method of claim 11, wherein determining whether the determination result is reliable based on the correlation between the measured width obtained at the best inclination angle and the slice-measured width comprises:
determining that the method for determining the bottom contour of the semiconductor structure is reliable responsive to that the correlation is more than or equal to a preset correlation, and determining that the determination result is unreliable responsive to that the correlation is less than a preset correlation.

13. The method of claim 12, wherein the preset correlation is 0.7.

14. A non-transitory computer-readable storage medium, having stored thereon a computer program that, when being executed by a processor, implements the method of claim 1.

15. A computer device, comprising a memory and a processor, wherein the memory stores a computer program, and the processor executes the computer program to implement operations of:
acquiring a best inclination angle of an electron beam;
irradiating a sidewall of a semiconductor structure with the electron beam at the best inclination angle, to obtain a measured width of an orthographic projection of the sidewall of the semiconductor structure within a plane perpendicular to an incidence direction of the electron beam; and determining whether a bottom of the semiconductor structure is necked based on the measured width.

16. The computer device of claim 15, wherein acquiring the best inclination angle of the electron beam comprises:

preparing a plurality of test semiconductor structures, the plurality of test semiconductor structures being obtained under different process conditions respectively;

performing slice measurement on the plurality of test semiconductor structures, to obtain a slice-measured dataset comprising slice-measured data of the plurality of test semiconductor structures;

irradiating sidewalls of the test semiconductor structures under different process conditions with the electron beam at a plurality of inclination angles respectively to obtain an angle-measured dataset, the angle-measured dataset comprising angle-measured data of orthographic projection of the sidewall of each test semiconductor structure within a plane perpendicular to incidence direction of the electron beam at each of the plurality of inclination angles;

comparing the angle-measured dataset with the slice-measured dataset, and selecting an inclination angle corresponding to the angle-measured data that is same as the slice-measured data in change rule; and responsive to that one inclination angle is selected, determining the selected inclination angle as the best inclination angle; and responsive to that more than one inclination angle is selected, irradiating the sidewall of a same test semiconductor structure for many times with the electron beam at each of the selected inclination angles, to obtain a plurality of measured datasets of the orthographic projection of the sidewall of the test semiconductor structure within the plane perpendicular to the incidence direction of the electron beam at each selected inclination angle, and selecting the inclination angle corresponding to a measured dataset with a best concentration rate as the best inclination angle.

17. The computer device of claim 15, wherein irradiating the sidewall of the semiconductor structure with the electron beam at the best inclination angle, to obtain the measured width of the orthographic projection of the sidewall of the semiconductor structure within the plane perpendicular to the incidence direction of the electron beam comprises:

acquiring an orthographic projection of the semiconductor structure within the plane perpendicular to the incidence direction of the electron beam at a best inclination angle; and measuring the orthographic projection to obtain the measured width at the best inclination angle.

18. The computer device of claim 15, wherein the best inclination angle is larger than 0° and smaller than or equal to 30°.

19. The computer device of claim 15, wherein the semiconductor structure comprises a bit line contact structure and bit lines located on an upper surface of the bit line contact structure.

20. The computer device of claim 19, wherein the bit line contact structure is a doped polycrystalline silicon layer.

* * * * *